US006246105B1

(12) United States Patent
Morozumi et al.

(10) Patent No.: US 6,246,105 B1
(45) Date of Patent: *Jun. 12, 2001

(54) SEMICONDUCTOR DEVICE AND MANUFACTURING PROCESS THEREOF

(75) Inventors: Yukio Morozumi, Chino; Takenori Asahi, Nagano-ken, both of (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/183,594

(22) Filed: Oct. 30, 1998

(30) Foreign Application Priority Data

Nov. 5, 1997 (JP) ................................... 9-318975

(51) Int. Cl.[7] .................................. H01L 23/58

(52) U.S. Cl. .................... 257/640; 257/637; 257/641; 257/644

(58) Field of Search ................................ 257/639, 635, 257/637, 640, 641, 644, 649, 626, 324; 438/114, 465, 724, 744

(56) References Cited

U.S. PATENT DOCUMENTS

| | | | |
|---|---|---|---|
| 5,378,652 | * 1/1995 | Samata et al. | 257/637 |
| 5,716,890 | * 2/1998 | Yao | 257/644 |
| 5,789,819 | * 8/1998 | Gnade et al. | 257/759 |
| 5,936,295 | * 8/1999 | Havemann et al. | 257/644 |

FOREIGN PATENT DOCUMENTS

163521 * 6/1994 (JP) .

OTHER PUBLICATIONS

M. Matsuura and M. Hirayama, ULSI Laboratory, Mitsubishi Electric Corp. "*Substrate–Dependent Characteristics Of CVD Oxide Using $S_iH_4$ and $H_2O_2$ Chemistry*", 1995, pp. 1–2.

M. Kubo, K. Yahiro and K. Tomita, Semiconductor Manufacturing Engineering Center, Toshiba Corp., "NMOS Hot Carrier Reliability Evaluation In CVD Oxide Using $SiH_4$ and $H_2O_2$ Chemistry", 1997, pp 1–2.

H. Nishimura, M. Matsuura, Y. Hayashide, M. Hirayama and H. Iuchi, ULSI Laboratory of Mitsubishi Electric Corp. & Ryoden Semiconductor, "*A Novel Interlayer Dielectric Process Using CVD Oxide With $SiH_4$ and $H_2O_2$ Chemistry*", 1995, pp 1–2.

(List continued on next page.)

*Primary Examiner*—Steven Loke
*Assistant Examiner*—Hung Kim Vu

(57) ABSTRACT

A semiconductor device having an insulation protection film with increased reliability and improved device characteristics, and a manufacturing method thereof which improves the planarization and reduces the interlayer capacitance of the device. The semiconductor device has a semiconductor substrate including a MOS device, a plurality of wiring regions formed on the semiconductor substrate, and a protective insulation film formed on the top layer of the wiring regions. The protective insulation film includes a first silicon oxide film, a second silicon oxide film formed on the first silicon oxide film, and a silicon nitride film composing the top layer. The process of forming the protective insulation film includes the following steps: forming the first silicon oxide film through a reaction between a silicon compound and at least one of oxygen and a compound containing oxygen by chemical vapor deposition method, forming the second silicon oxide film on the first silicon oxide film by a condensation polymerization reaction between a silicon compound and hydrogen peroxide by chemical vapor deposition, conducting an annealing treatment at a temperature of 350–500° C., and forming the silicon nitride film.

4 Claims, 8 Drawing Sheets

OTHER PUBLICATIONS

M. Matsuura, H. Nishimura, Y. Hayashide, M. Hirayama and H. Iuchi, ULSI Laboratory of Mitsubishi Electric Corp. and Ryoden Semiconductor, "*A Novel Interlayer Dielectric Process Using CVD Oxide With $SiH_4$ and $H_2O_2$ Chemistry*", 1995, pp 1–2.

T. Yoshie, K. Shimokawa and M. Yoshimura, VLSI R&D Center, Oki Electric Industry Co., Ltd., "*Deposition Characteristics Of $SiH_4/H_2O_2$ CVD $SiO_2$*", 1997, pp 1–2.

S. McClatchie, K. Beekmann, A. Kiermasz and C. Dobson, Electrotech Ltd., Bristol, U.K., "*Low Dielectric Constant Flowfill® Technology For IMD Applications*", 97, pp. 1–7.

M. Matsuura and M. Hirayama, ULSI Laboratory, Mitsubishi Electric Corp., "*An Advanced Planarizing Interlayer Dielectric Using $SiH_4$ and $H_2O_2$ Chemistry*", 1995, pp. 261–268.

A. Kiermasz, C.D. Dobson, K. Beekman, Electrotech Ltd., U.K. and A. Hass Bar–Ilan, Tower Semiconductor Ltd., "*Planarisation For Sub–Micron Devices Utilising A New Chemistry*", 1995, pp. 1,3,5,7.

S. McClatchie, K. Beekman, A. Kiermasz and C. Dobson, Electrotech Ltd., U.K. "*Inorganic CVD Planarisation*", 1995, pp. 1–3.

* cited by examiner (A)

(B)

(C)

(A)

(B)

(A)

(B)

(A)

(B)

SEMICONDUCTOR DEVICE AND MANUFACTURING PROCESS THEREOF

BACKGROUND OF THE INVENTION

1. Field of the Invention

The present invention relates to a semiconductor device and a method of manufacturing thereof, and more particularly to a semiconductor device which has a protective insulation film formed on a metal wiring miniaturized to a size less than a half micron and a method for manufacturing such a semiconductor device.

2. Description of the Related Art

A protective insulation film is formed on the top metal wiring layer of a semiconductor device for LSI and the like in order to prevent physical damage, contamination and moisture invasion. For a protective insulation film, a silicon nitride film grown at low temperature by plasma vapor deposition is commonly used. Also, a protective insulation film having a laminated structure with a silicon oxide film formed under a silicon nitride film to relieve the stress is used. For example, the protective insulation film with a laminated structure includes a silicon oxide film formed by vapor deposition technique using monosilane and oxygen or nitrogen oxide, or a PSG (phosphorus glass) film formed by doping a silicon oxide with phosphorus, or an SOG (spin on glass) film and a silicon nitride film having a thickness of about 1 μm formed by plasma chemical vapor deposition using monosilane and ammonia or nitrogen gas.

These protective insulation films are selectively etched by dry etching or wet etching using a photoresist as a mask, and has an opening to define a bonding pad section for leading out an external electrode.

It should be noted that when a semiconductor device is miniaturized to less than a sub micron, the etching process on the metal wiring layers uses anisotropic dry etching, which results in the side wall of the metal wiring layers having a steep, almost vertical slope. As a result, voids are likely formed in certain areas on the metal wiring layers because a silicon oxide film and a silicon nitride film that compose a protective insulation film have poor adhesion and fluidity due to cusping. These voids become contamination traps. Also, the thickness of the silicon nitride film on side walls and corners of a groove of the metal wiring layers becomes extremely thin compared to that of the plane section of the silicon nitride film. As a result, moisture and contaminants would likely enter through the thin film portions, which presents long-term reliability problems.

Further, it is necessary to reduce inter-layer insulating film capacitance in order to increase the operation speed of the device. Therefore, conventionally, particular attention is paid to the inter-layer insulating film capacitance between a metal wiring layer and a substrate, or between upper and lower wiring layers. However, miniaturization of wiring space increases the effect of the inter-layer insulating film capacitance in the transverse direction. Therefore, when a protective insulation film has a structure in which a silicon nitride film having a high dielectric constant is present in a space between metal wiring layer formed in the same process, the inter-layer insulating film capacitance in the transverse direction cannot be ignored in light of electric characteristics such as the operation speed, etc.

OBJECTS OF THE INVENTION

Therefore, it is an object of the present invention to provide a semiconductor device and a process of manufacturing thereof having a protective insulation film which improves the reliability and enhances the device characteristics by improving the planarization and reducing the inter-layer insulating film capacitance.

SUMMARY OF THE INVENTION

In a method of manufacturing a semiconductor device in accordance with the present invention, in which the semiconductor device includes a semiconductor substrate including a plurality of wiring regions formed on the semiconductor substrate, a protective insulation film formed on the top-most wiring region, the step of forming the protective insulation film includes the following steps (a) through (d):

(a) forming a first silicon oxide film through a reaction between a silicon compound and at least one of oxygen and a compound containing oxygen by chemical vapor deposition;

(b) forming a second silicon oxide film through a reaction between a silicon compound and hydrogen peroxide by chemical vapor deposition;

(c) annealing at a temperature in the range of 350–500° C.; and (d) forming a silicon nitride film.

In accordance with the present semiconductor device manufacturing method, the second silicon oxide film is formed through the reaction between a silicon compound and hydrogen peroxide by chemical vapor deposition in step (b), and therefore layers having a high degree of flatness can be formed at a lower temperature. In other words, the second silicon oxide film formed in step (b) has high fluidity and superior self-flattening characteristics. It is believed that these characteristics are achieved by the following mechanism. The reaction between a silicon compound and hydrogen peroxide by chemical vapor deposition produces silanol in the vapor-phase, and the silanol is deposited on the surface of the wafer to thereby form a highly fluid film.

For example, when monosilane is used as a silicon compound, silanol is produced through the reaction shown in the following formulas (1) and (1)'.

Formula (1)

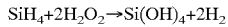

$$SiH_4 + 2H_2O_2 \rightarrow Si(OH)_4 + 2H_2$$

Formula (1)'

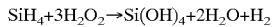

$$SiH_4 + 3H_2O_2 \rightarrow Si(OH)_4 + 2H_2O + H_2$$

The silanol produced by the reactions under the Formulas (1) and (1)' changes to silicon oxide through water elimination which is caused as a result of a condensation polymerization reaction presented by Formula (2).

Formula (2)

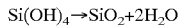

$$Si(OH)_4 \rightarrow SiO_2 + 2H_2O$$

The silicon compounds include, for example, inorganic silane compounds such as monosilane, disilane, $SiH_2Cl_2$, $SiF_4$, and organic silane compounds such as $CH_3SiH_3$, as tripropylsilane and tetraethoxysilane.

Also, the above film forming step (b) is preferably conducted by a reduced pressure chemical vapor-growth method at a temperature in the range of 0–20° C. when the silicon compound is one of the inorganic silicon compounds, and at a temperature in the range of 100–150° C. when the silicon compound is one of the organic silicon compounds. In this film growth process, temperatures higher than the above upper limit cause an excessive condensation polymerization reaction, which lowers the fluidity of the second silicon oxide film and makes it difficult to obtain a desirable flatness. On the other hand, temperatures lower than the lower limit cause adsorption of decomposed water within the chamber and dewing outside the chamber, impeding control over the film growth device.

The second silicon oxide film produced in the above step (b) is preferably formed to have a sufficient thickness to cover step differences on the surface of the wafer substrate. In other words, it should be thick enough to cover the uneven top surface of the first silicon oxide film located under the second silicon oxide film. The thickness of the second silicon film is preferably between 500 and 1,000 nm, although the lower limit thereof depends on the height of unevenness of the first silicon oxide film under the second silicon oxide film. When the thickness of the second silicon oxide film exceeds the above-described upper limit, cracks may occur in the film by stress of the film itself.

In the present invention, the first silicon oxide film is formed as a base layer by the reaction between a silicon compound and at least one of oxygen and a compound including oxygen through chemical vapor deposition before step (b). The base layer has passivation function that prevents water and excess impurity in the second silicon oxide film from moving therebelow, and also has another function to increase the bonding of the second silicon film.

After step (b), a third porous silicon oxide film is preferably formed on the second silicon oxide film by the reaction between a silicon compound, at least one of oxygen and a compound including oxygen, and a compound including an impurity through a chemical vapor deposition method (step (e)).

The third silicon oxide film functions not only as a cap layer, but also with its porous feature can gradually discharge gas components generated from the second silicon oxide film during the annealing treatment to be conducted in the step (c) that follows. Further, the third silicon oxide film, in addition to its porosity, can compose a moderately flexible and unbreakable layer by relieving the film stress through weakening the Si-O intermolecular attraction by the addition of impurities such as phosphorus, boron and the like (preferably phosphorus). Considering the stress relief factor, a preferred concentration of impurity contained in the third silicon oxide film is 1–6 weight %.

Also, the third silicon oxide film functions to prevent generation of cracks caused by an increase in the tensile stress during the condensation polymerization of the second silicon oxide film because it has a compression stress of 100–600 MPa. Further, the third silicon oxide film functions to prevent the second silicon oxide film from absorbing moisture.

The above step (e) should preferably be conducted by plasma chemical vapor deposition method with a high frequency of less than 1 MHz at a temperature between 300 and 450° C. The film growth process under this temperature condition makes easier the discharge of gas components in the initial annealing stage in step (c), resulting in a higher device reliability.

A compound including oxygen used in the above step (e) is preferably nitrogen monoxide ($N_2O$). The use of nitrogen monoxide ($N_2O$) as a reaction gas promotes the elimination of gasification components (hydrogen, water) in the second silicon oxide film even during the growth period of the third silicon oxide film because the plasma state of $N_2O$ tends to react with the hydrogen bond (–H) of the silicon compound in the second silicon oxide film.

The above step (e) can be conducted by the normal pressure chemical vapor deposition method at a temperature ranging between 300 and 500° C. instead of the plasma chemical vapor deposition method. In this case, ozone is preferably used as the compound including oxygen in step (e).

Further, in step (e), the second silicon oxide film is preferably exposed to ozone atmosphere before growing the third silicon oxide film. Through this step, the elimination of hydrogen and water within the second silicon oxide film is promoted because ozone tends to react with the hydrogen bond (—H) and the hydroxyl (—OH) that compose the second silicon oxide film.

Also, the thickness of the third silicon oxide film is preferably 100 nm or more in consideration of planarization and prevention of cracks.

Through the annealing process at a temperature in the range of 350–500° C. in step (c), the second and third silicon oxide films formed in steps (b) and (e) are densified and their insulation capability and moisture-resistance capability are improved.

The condensation polymerization reaction under Formula (2) described above is completed in the initial stage of the annealing treatment, and hydrogen and water generated in association with the reaction are discharged externally through pores of the third silicon oxide film. As a result, the second silicon oxide film is formed with high density and with the gasification components being thoroughly discharged therefrom. The third silicon oxide film changes from a porous film to a densified film by the annealing treatment.

The annealing treatment at temperatures over 350° C. can adequately densify the second and third oxide films. However, the annealing treatment at a temperature over 500° C. may thermally damage the metal wiring layer formed from an alloy or metal such as aluminum.

By forming the third porous silicon oxide film on the second silicon oxide film, the annealing treatment is conducted without causing cracks in the second silicon film even when there are drastic changes in temperature, for example when a wafer is directly exposed to a temperature in the range of 350–500° C. in the annealing treatment in step (c), because the third silicon oxide film has a moderate flexibility and restricts the rapid discharge of water, and therefore absorbs stress generated in the second silicon oxide film.

Furthermore, after the annealing treatment in step (c), a silicon nitride film is formed by chemical vapor deposition or, preferably, plasma chemical vapor deposition in step (d). The thickness of the silicon nitride film is preferably between 300 and 1,500 nm in consideration of moisture resisting and contamination resisting capability.

The manufacturing method in accordance with the present invention provides the first silicon oxide film and the second silicon oxide film with sufficient planarization. As a result, the silicon nitride film on the top layer has good adhesion and fluidity, less locally thin areas and less defects, and therefore achieves an increased reliability as a protection film with high moisture resisting and contamination resisting capability.

The semiconductor device manufactured according to the manufacturing method described above includes a semiconductor substrate, a plurality of layered wiring regions formed on the semiconductor substrate, a protective insulation film formed on the top-most wiring region layer, wherein the protective insulation film comprises a first silicon oxide film, a second silicon oxide film formed on the first silicon oxide film by a condensation polymerization reaction between a silicon compound and hydrogen peroxide, and a silicon nitride film defining the top-most layer of the protective insulation film.

The semiconductor device, as described above, not only has a highly reliable protection insulation film, but also has a silicon oxide film having a lower dielectric constant filled in a space between adjacent wiring layers formed in the same process on the top most metal wiring layer. As a result, the silicon nitride film having a high dielectric constant presents only small influence, and a higher operation speed is achieved compared to the conventional structure.

In accordance with the present invention, a silicon oxide film that is produced, using the same step as step (b), by the reaction between a silicon compound and hydrogen peroxide by chemical vapor deposition method is preferably applied to an interlayer insulation film formed on a semiconductor substrate having devices such as MOS devices, and to a planarization layer of interlayer insulation films between metal wiring layers.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 1:
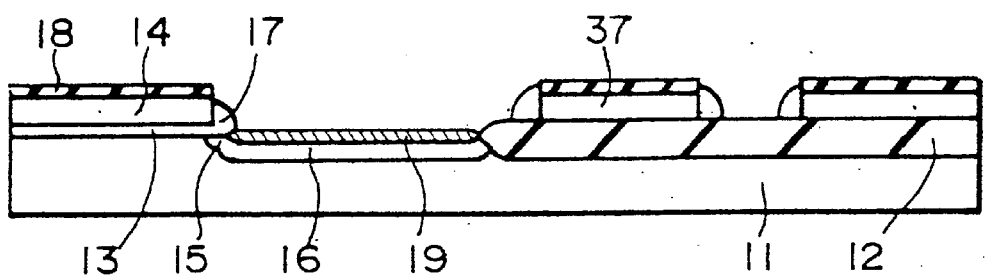
FIGS. 1(A), 1(B) and 1(C) schematically show cross-sectional views illustrating steps of a method for manufacturing a semiconductor device in accordance with embodiments of the present invention.
Figure 1:
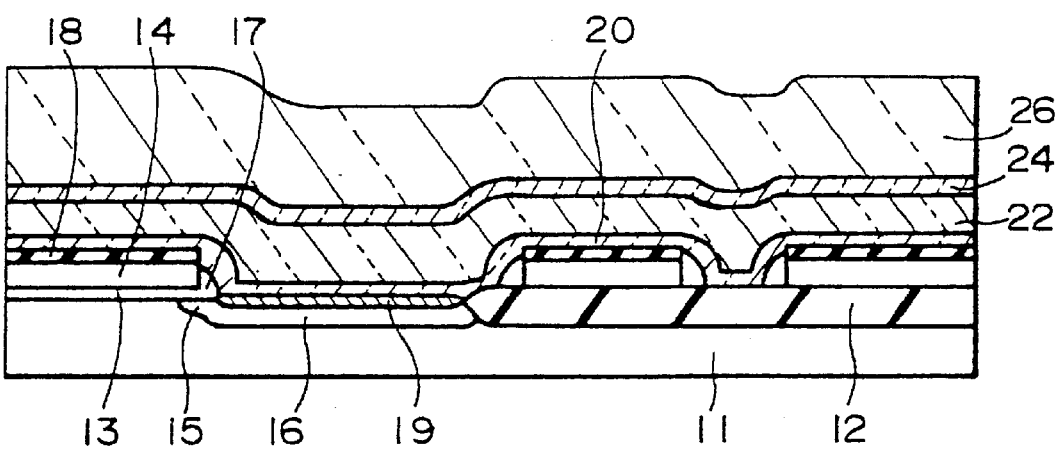
Figure 1:
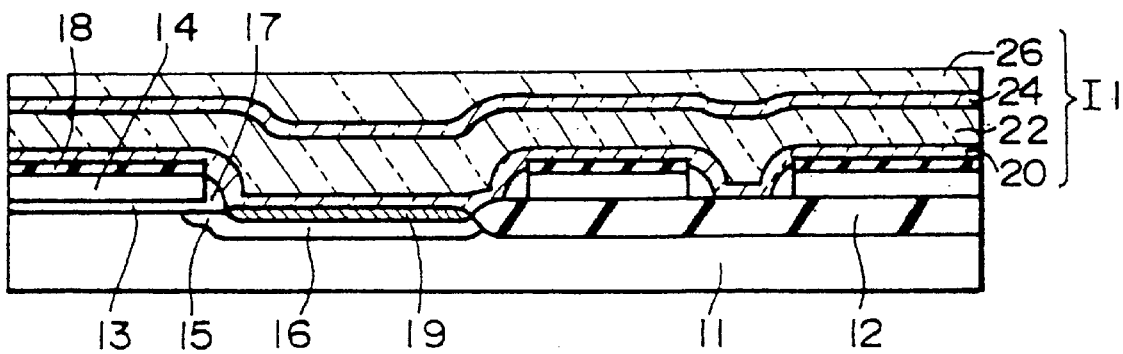
Figure 2:
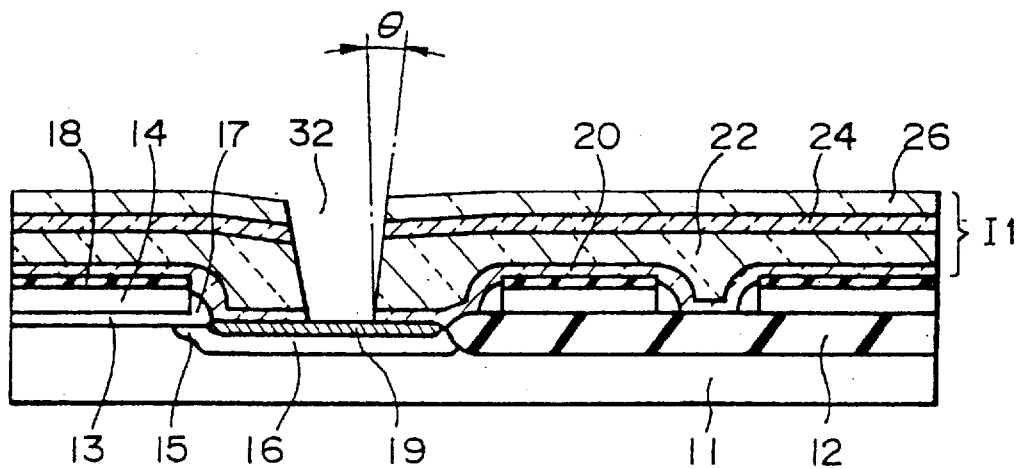
FIGS. 2(A) and 2(B) schematically show cross-sectional views illustrating a method for manufacturing a semiconductor device to be conducted after the process shown in FIG. 1 in accordance with embodiments of the present invention.
Figure 2:
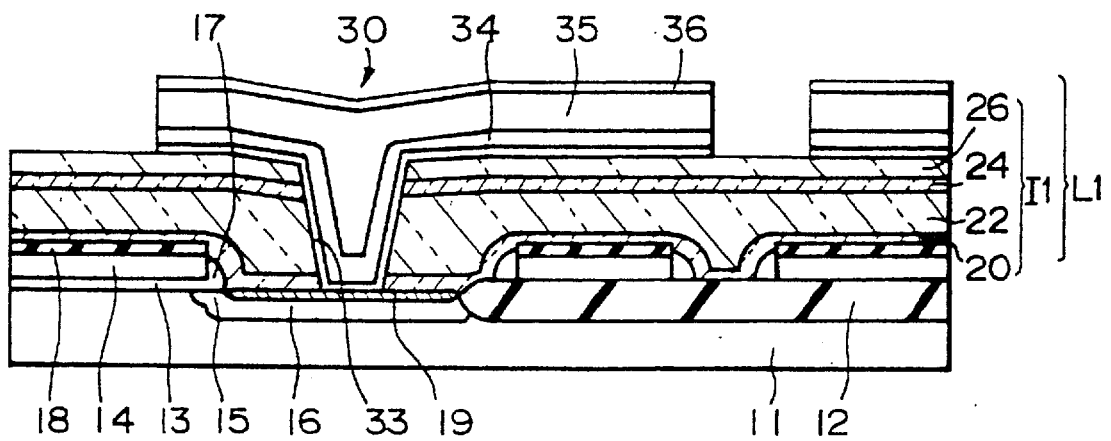
Figure 3:
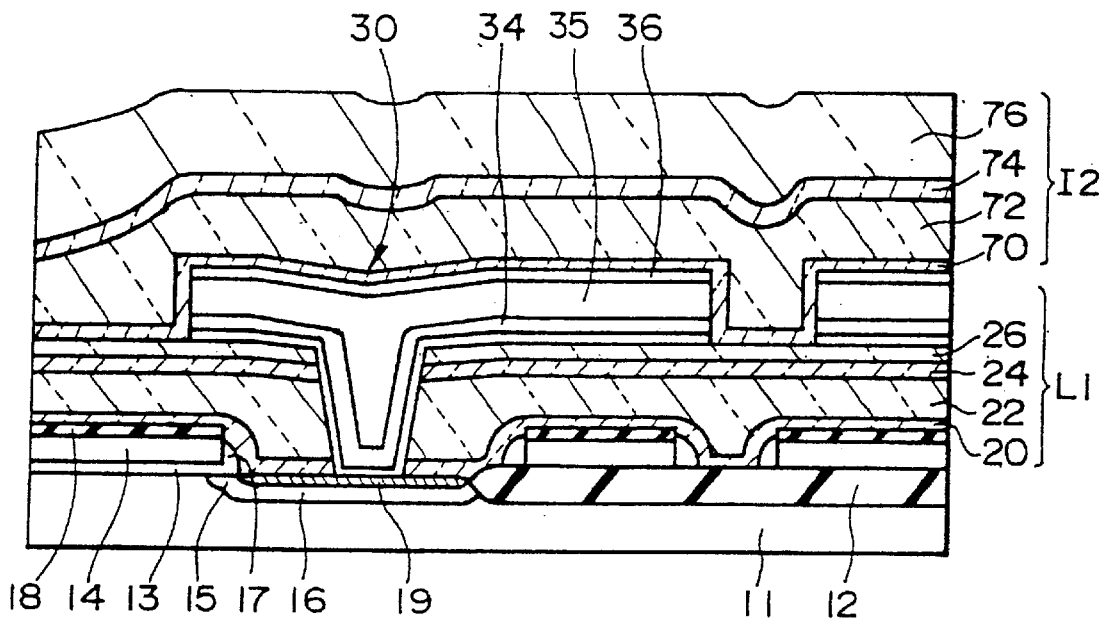
FIGS. 3(A) and 3(B) schematically show cross-sectional views illustrating a method for manufacturing a semiconductor device to be conducted after the process shown in FIG. 2 in accordance with embodiments of the present invention.
Figure 3:
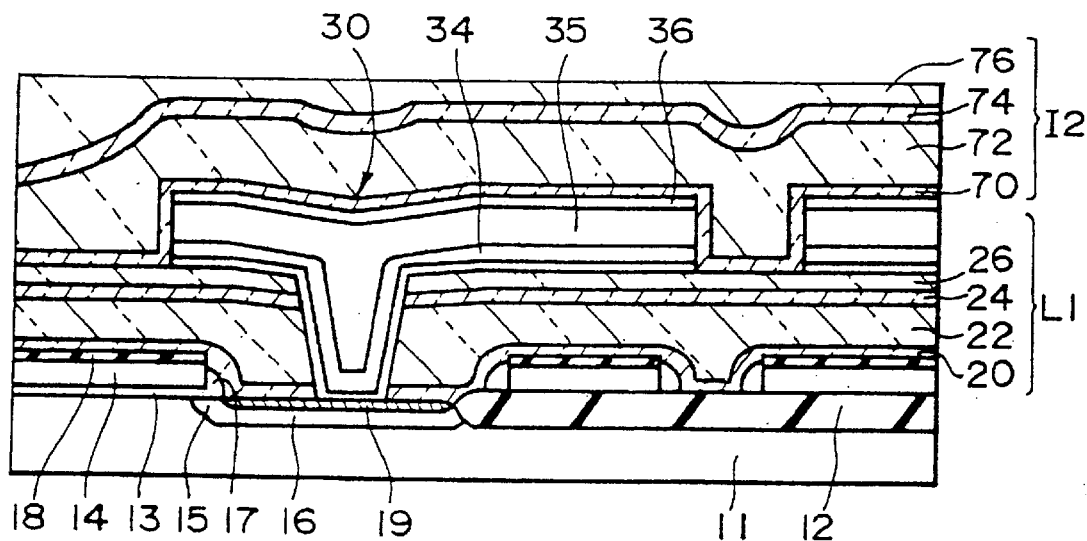
Figure 4:
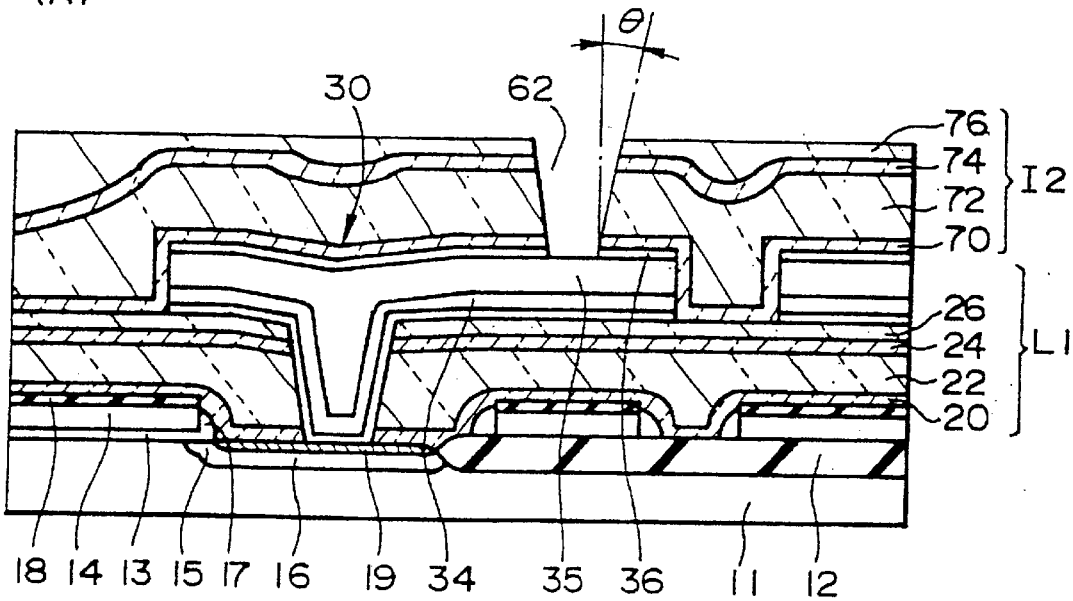
FIGS. 4(A) and 4(B) schematically show cross-sectional views illustrating a method for manufacturing a semiconductor apparatus to be conducted after the process shown in FIG. 3 in accordance with embodiments of the present invention.
Figure 4:
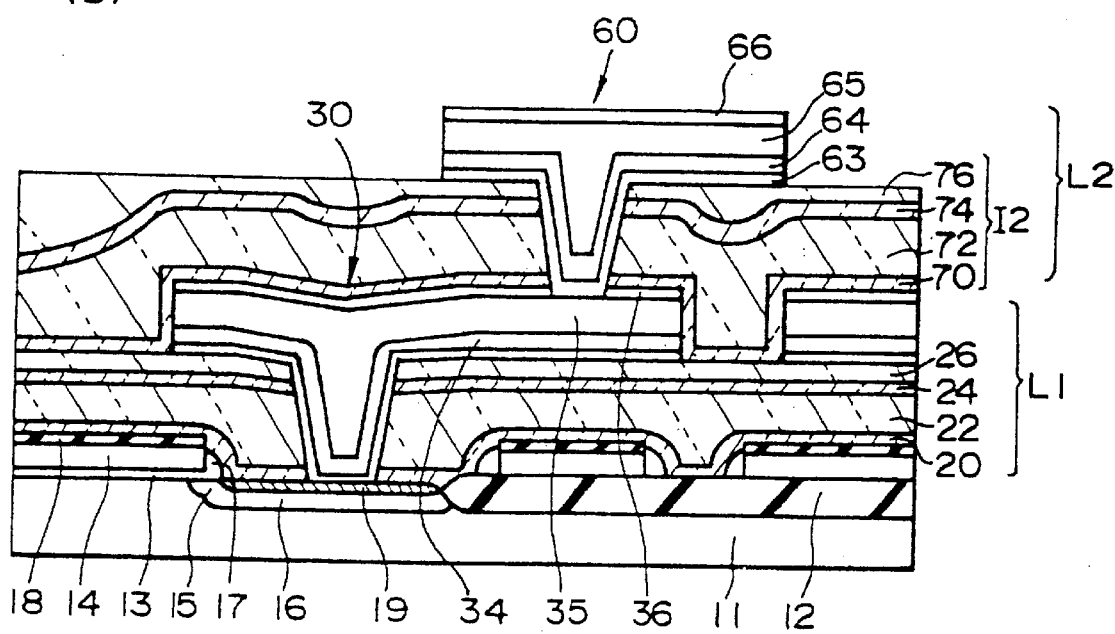
Figure 5:
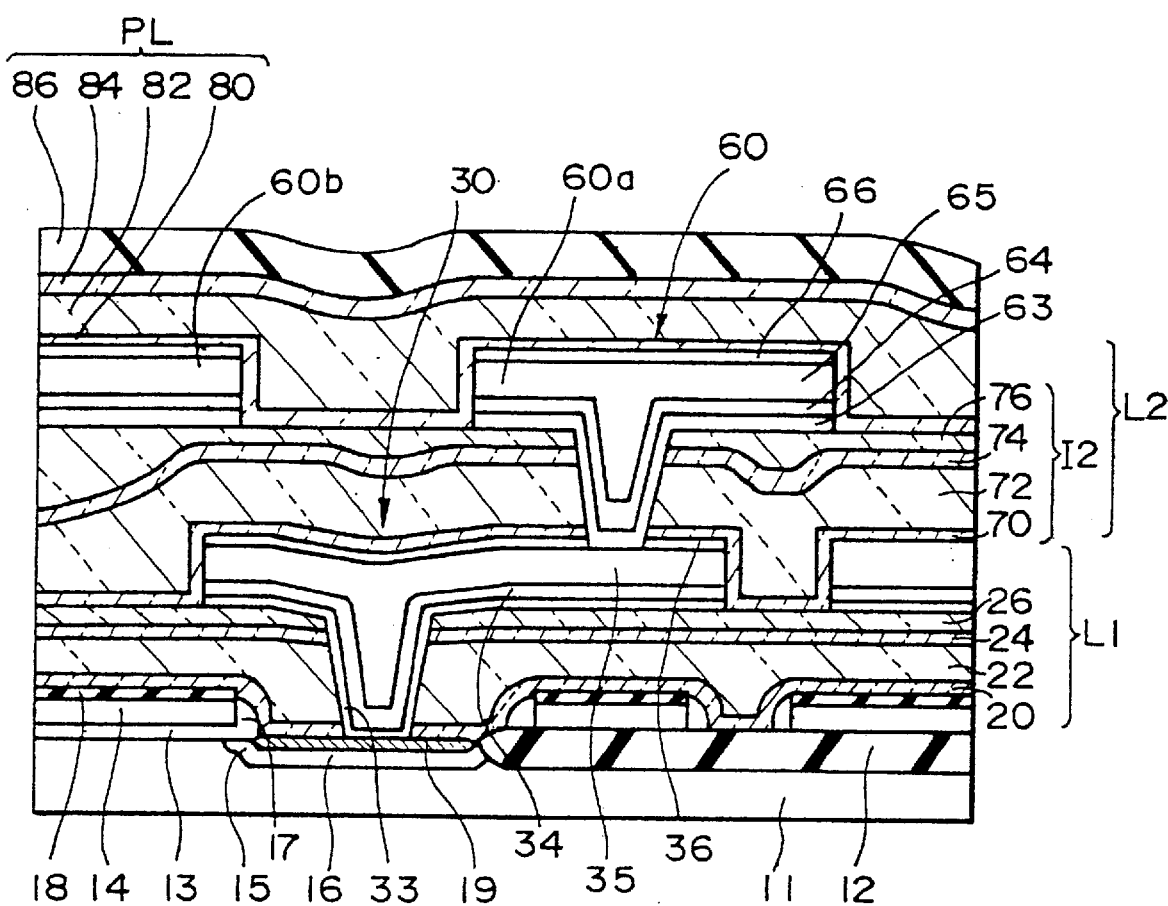
FIG. 5 schematically shows a cross-sectional view illustrating a method for manufacturing a semiconductor device shown in FIG. 4.

Reference is now made to FIGS. 1 through 5 which schematically show cross-sectional views illustrating a method of manufacturing a semiconductor device and a semiconductor device formed by the method in accordance with an embodiment of the present invention. FIGS. 1(A)–1(C), and FIGS. 2(A)–2(B) illustrate steps of manufacturing a first wiring region layer, L1. FIGS. 3(A)–3(B) and FIGS. 4(A)–4(B) illustrate steps of manufacturing a second wiring region layer, L2. FIG. 5 illustrates steps of manufacturing a protective insulation film with a multilayered structure.

A method for manufacturing a semiconductor device in accordance with an embodiment of the present invention is described below.

(A) Steps illustrated in FIG. 1(A) are described below.

Formation of Device

First, a MOS device is formed on a silicon substrate 11 by a commonly practiced method. More specifically, for example, a field insulation film 12 is formed on the silicon substrate 11 by selective oxidization, and a gate oxide film 13 is formed on an active region. After adjusting the threshold voltage by channel injection, tungsten silicide is sputtered on a polysilicon film that is grown by thermal decomposition of $SiH_4$, after which a silicon oxide film 18 is further deposited thereon, and a gate electrode 14 is formed into a predetermined pattern by etching the polysilicon film and tungsten suicide. Depending on requirements, a wiring layer 37 comprised of the polysilicon film and the tungsten suicide film is formed on the field insulation film 12.

Next, a low concentration impurity layer 15 for a source region or a drain region is formed by a phosphorus ion implantation. After a side wall spacer 17 formed from a silicon oxide film is formed on the side of the gate electrode 14, and then subjected to an arsenic ion implantation. The impurity is activated by an annealing treatment, using a halogen lamp to form a high impurity concentration layer 16 for the source region or the drain region.

Next, a vapor deposited silicon oxide film having a thickness of less than 100 nm is formed, and selectively etched in an aqueous solution mixed with HF and $NH_4F$ to expose a predetermined silicon substrate region. Then, for example, titanium is sputtered to a thickness of 30|100 nm, and an annealing is conducted for a period of time ranging from a few to approximately 60 seconds at temperature of 650–750° C. in a nitrogen atmosphere with controlled oxygen content of less than 50 ppm. As a result, a titanium monosilicide layer is formed on the exposed surface of the silicon substrate and a titanium rich-titanium nitride (TiN) layer is formed on the silicon oxide film 18. Then, when immersed in an aqueous solution mixed with $NH_4OH$ and $H_2O_2$, the titanium nitride layer is etched away and only the titanium monosilicide layer remains on the surface of the silicon substrate. Further, the monosilicide layer is changed to a disilicide layer by lamp annealing at temperature of 750–850° C. to thereby form a titanium silicide layer 19 in a self-alignment manner on the surface of the high impurity concentration layer 16.

When the gate electrode 14 is formed only by polysilicon, and exposed by selective etching, there is provided a titanium salicide structure in which the gate electrode and source/drain regions are separated by side wall spacers.

The salicide structure may be comprised of tungsten suicide or molybdenum suicide instead of titanium sulicide.

(B) Steps illustrated in FIG. 1(B) are described below.

Formation of First Interlayer Insulation Film I1

A first interlayer insulation film I1 is comprised of four silicon oxide film layers, namely, a first silicon oxide film 20, a second oxide film 22, a third silicon oxide film 24, and a fourth silicon oxide film 26, from the bottom in this order.

a. Formation of the first silicon oxide film 20

First, by the reaction between tetraethoxysilane (TEOS) and oxygen by plasma chemical vapor deposition at temperature of 300–500° C., the first silicon oxide film 20 having a thickness of 100–200 nm is formed. The silicon oxide film has a high density because it has no cusping or oxidation of the silicide layer 19, and has a higher insulation level and a slower etching speed against a hydrogen fluoride aqueous solution than those of a film grown from $SiH_4$.

In this embodiment, the silicon oxide film 20 is directly formed on the titanium silicide layer 19. If the film forming temperature is high, the oxide gas and the titanium silicide readily react with each other in the initial film forming stage, and cracks and separations are likely caused. Accordingly, the treatment temperature is preferably at 600° C. or lower, more preferably, in the range of 250–400° C. After the silicon oxide film is formed at a thickness of about 100 nm on the titanium silicide layer at a relatively lower temperature, the treatment temperature can be increased up to about 900° C. in the annealing treatment or the vapor-phase oxide treatment that allows exposure to oxide ambiance other than water vapor.

b. Formation of the second silicon oxide film 22

Next, the second silicon oxide film 22 is formed by reacting $SiH_4$ and $H_2O_2$ by CVD method, using nitrogen gas as a carrier, preferably at a reduced pressure lower than $2.5 \times 10^2$ Pa, or more preferably at a pressure between $0.3 \times 10^2 – 2.0 \times 10^2$ Pa. The second silicon oxide film 22 has a film thickness greater than at least a step difference in the underlying first silicon oxide film 20, in other words, it is formed with a film thick enough to cover the step difference of the underlying first silicon oxide film 20. The upper limit in the film thickness of the silicon oxide film 22 is set within a range that prevents generation of cracks in the film. More specifically, the film thickness of the second silicon oxide film 22 is preferably greater than the step difference of the underlying layer, preferably between 300–1,000 nm, in order to secure an optimum planarization.

The film growth temperature of the second silicon oxide film 22 affects the fluidity of the film during film growth. A high film growth temperature lowers the fluidity of the film and hampers planarization of the film. Therefore, the film forming temperature is preferably set at 0–20° C., and more preferably at 0–10° C.

There is no specific limitation in flow quantity of $H_2O_2$, but the flow quantity is preferably be two times greater than the flow quantity of $SiH_4$, and preferably set for example within a flow quantity range of 100–1,000 SCCM in gas quantity equivalent in consideration of the uniformity and throughput of the film.

The second silicon oxide film 22 formed in this step is in a state of silanolpolymer and has a high fluidity as well as a high self-flattening characteristic. Also, the second silicon oxide film 22 has a high hygroscopicity because it contains many hydroxyls (—OH).

c. Formation of the third silicon oxide film 24

A PSG film (third silicon oxide film) 24 with a thickness of 100–600 nm is formed through gas reaction by plasma CVD method at high frequency between 200 and 600 kHz, at temperature of 300–450° C. under the presence of $SiH_4$, $PH_3$ and $N_2O$. The third silicon oxide film 24 is preferably formed successively after forming the second silicon oxide film 22 in consideration of its high hygroscopicity, or preferably after the second silicon oxide film 22 is preserved in an ambiance that contains no moisture.

The third silicon oxide film 24 needs to be porous in consideration that gasification components such as water and hydrogen are readily and completely eliminated from the second silicon oxide film 22 in an annealing treatment that follows. Accordingly, the third silicon oxide film 24 is preferably formed by plasma CVD method preferably at temperature of 450° C. or lower, and more preferably between 300 and 400° C., at a frequency of 1 MHz or lower, and more preferably at a frequency between 200 and 600 kHz, and preferably includes an impurity such as phosphorus. Since the third silicon oxide film 24 includes such impurity, the third silicon oxide film 24 becomes more porous and therefore is capable of relieving stresses generated within the film and also has gettering effect on alkali ions. The concentration of such an impurity is determined in consideration of the gettering effect and other aspects. For example, when phosphorus is used as an impurity, 2|6 weight % of impurity is preferably contained.

When $N_2O$ is used as a compound having oxygen in the plasma CVD, elimination of hydrogen bonds in the second silicon oxide film 22 is promoted. As a result, gasification components such as water and hydrogen gas are more securely removed from the second silicon oxide film 22.

The thickness of the third silicon oxide film 24 is preferably 100 nm or more, and more preferably between 100–600 nm, in consideration of its role to adjust the required thickness of interlayer insulation films and the function of $N_2O$ plasma to eliminate hydrogen bonds.

d. Anneal treatment

Next, anneal treatment is conducted at a temperature between 600 and 850° C. in a nitrogen atmosphere. The second silicon oxide film 22 and the third silicon oxide film 24 are densified by the anneal treatment and acquire good insulation and water-resisting qualities. In other words, at an anneal temperature of 600° C. or higher, condensation polymerization reaction of silanol in the second silicon oxide film 22 is almost perfectly completed, eliminating water and hydrogen contained in the films so that the films with high density are formed. Also, by setting the anneal temperature at 850° C. or lower, the miniaturization of devices is achieved without causing adverse effects such as punch-through and junction leak in the diffused region of the source region or the drain region that form a MOS transistor.

As for the anneal treatment, ramping anneal treatment in which the temperature of the wafer is increased in a stepwise fashion or in a continuous fashion, is desirable in order to reduce effects of thermal strain to the second silicon oxide film 22. For example, when the temperature of the wafer is kept at temperature of about 400° C. and thereafter raised to an annealing temperature (at 600–850° C.), the impurity concentration of the third silicon oxide film 24 is considerably lowered. For example, when phosphorus is used as an impurity, it is confirmed that the phosphorus density of two weight % or less does not cause cracks in the second silicon oxide film 22, except the gettering effect of mobile ions.

e. Formation of the fourth silicon oxide film 26

Next, the fourth silicon oxide film 26 having a thickness of 1,000–1,500 nm is formed by plasma CVD method at 350–400° C. by using TEOS and oxygen.

A TEOS-oxygen silicon oxide film produced by the plasma CVD method, even without annealing, has a dry etching speed which is equivalent to or a slightly faster than that of the second silicon oxide film 22 or the third silicon oxide film 24 that are annealed at a high temperature. This serves the basis for creating well-shaped contact holes without any constricted parts or steps being formed on the side surface of the holes in the contact hole forming process, which will be discussed below.

(C) Steps shown in FIG. 1(C) are described below.

Flattening by CMP

Next, a predetermined thickness of the fourth silicon oxide film 26 and, if required, the third silicon oxide film 24 and the second silicon oxide film 22, is polished by chemical mechanical polishing (CMP) method to polish and flatten the films. The second silicon oxide film 22, the third silicon oxide film 24 and the fourth silicon oxide film 26 have almost the same polishing speed. Therefore, even when portions of the third silicon oxide film 24 or the second silicon oxide film 22 are exposed by polishing, flat surfaces are obtained, and therefore management of the amount of polishing for flattening the surface is easy.

For example, according to the research by the inventors of the present invention, polishing speed for each silicon oxide film was as follows.

The second silicon oxide film (anneal temperature at 800° C.); 250 nm/min.

The third silicon oxide film (anneal temperature at 800° C.); 250 nm/min.

The fourth silicon oxide film (no annealing); 250 nm/min.

BPSG film for comparison (anneal temperature at 900° C.); 350 nm/min.

(D) Next, steps shown in FIG. 2(A) are described.

FORMATION OF CONTACT HOLE

Next, the silicon oxide films 20, 22, 24, and 26 that form the first interlayer insulation film I1 are selectively and anisotropically etched with reactive ion etcher containing $CHF_3$ and $CF_4$ as main gas. As a result, a contact hole 32 of 0.2–0.5 μm in diameter is formed.

The contact hole 32 defines a tapered through-hole having a reducing diameter linearly reducing from an upper section toward a bottom section thereof. Although the taper angle θ may vary depending on etching conditions and other factors, the taper angle is set, for example, at 5–15 degrees. Such a tapered through-hole is obtained because: first, the silicon oxide films 20, 22, 24, and 26 have basically almost the same etching speed, and the etching speed of the second silicon oxide film 22 is slightly slower than that of the third silicon oxide film 24; and second, interfaces of the silicon oxide films are very well bonded to one another. An aluminum film can be deposited in good condition in the tapered contact hole 32, which will be explained later in detail.

Dry etching speed of each silicon oxide film measured by the inventors is shown below. Dry etching is conducted under a predetermined condition in which the power is set at 800 W, an ambient pressure is set at 20Pa, and the etchant gas contains $CF_4$: $CHF_3$: He=1: 2: 9.

The second silicon oxide film (anneal temperature at 800° C.); 525 nm/min.

The third silicon oxide film (anneal temperature at 800° C.); 550 nm/min.

The fourth silicon oxide film (no annealing); 565 nm/min.

BPSG film for comparison (anneal temperature at 900° C.); 750 nm/min.

(E) Next, steps shown in FIG. 2(B) are described.

Degassing Treatment

First, a heat treatment including a degassing step will be described.

In a lamp chamber, lamp heating (thermal treatment A) is conducted at a base pressure less than $1.5 \times 10^{-4}$ Pa, for 30–60 seconds at the temperature of 150|250° C. Then, argon gas is introduced in another chamber at pressure of $1 \times 10^{-1}$–$15 \times 10^{-1}$ Pa, and heat treatment (degassing step; thermal treatment B) is conducted for 30–120 seconds at 150–550° C., to thereby conduct degassing treatment.

In this process, first, the thermal treatment A mainly removes moisture adhered to a wafer by heat treating the entire wafer including its rear surface and side surface.

Further, the thermal treatment B mainly removes gasification components (H, $H_2O$) from the second silicon oxide film 22 composing the first interlayer insulation film I1. As a result, when a barrier layer and an aluminum film are formed in the following steps to be conducted, generation of the gasification components from the first interlayer insulation film I1 can be prevented.

In accordance with the present invention, a barrier layer 33 is composed of a multilayered film including a barrier film having a barrier function and a conductive film. The conductive film is formed between the barrier film and an impurity diffusion layer formed on the silicon substrate, i.e., the source region or the drain region, in order to increase the conductivity between the barrier film and the impurity diffusion layer. The barrier film is preferably made of common materials such as titanium nitride and titanium tungsten. High melting point metals such as titanium, cobalt, tungsten and the like can be used as the conductive film. Each of titanium, cobalt, and tungsten reacts with the silicon of the substrate and becomes a silicide .

The barrier layer, for example, a TiN film or a Ti film contains several tens of atoms % of gasification components (O, H, $H_2O$, N) as solid solution. Accordingly, it is very important to remove the gasification components in the first interlayer insulation film I1 before forming these films in order to successfully form an aluminum film in the contact hole. Unless the gasification elements are completely removed from the first interlayer insulation film I1 existing underneath the barrier layer, the gasification components in the first interlayer insulation layer are discharged into the barrier layer at a barrier formation temperature (normally over 300° C.). Further, the gas is eliminated from the barrier layer when an aluminum film is formed and come out into an interface between the barrier layer and the aluminum film, causing deteriorating effects on cohesiveness and fluidity of the aluminum film.

Formation of the Barrier Layer

A titanium film having a thickness of 20–70 nm is formed by sputtering method to serve as a conductive film in the barrier layer 33. Then, a TiN film having a thickness of 30–150 nm is formed as a barrier film in another chamber. Sputtering is conducted at a sputtering temperature of 200–450° C. depending upon the film thickness.

The wafer is exposed to oxygen plasma at a pressure of $0.1 \times 10^2$|$1.5 \times 10^2$ Pa for 10|100 seconds, and annealed in a nitride or hydrogen atmosphere at 450|700° C. for 10–60 minutes. As a result, island-shaped titanium oxide is formed in the barrier layer. It is confirmed that this treatment increases the barrier capability of the barrier layer.

Instead of the oxygen plasma treatment, the anneal treatment can also be conducted by heat treatment at 400–800° C. in a lamp anneal furnace with at least several hundreds ppm to several % of oxygen contained therein. The barrier capability of the barrier layer can be likewise increased.

Although not shown, a wetting layer of titanium, cobalt, silicon or the like can be formed on the surface of the barrier layer 33 in order to improve wettability for an aluminum film, which is described below. By providing such a wetting layer, the fluidity of a first aluminum layer is improved. The thickness of the wetting layer is normally sufficient if it is over several tens nm.

DEGASSING TREATMENT OF ALUMINUM FILM BEFORE FILM GROWTH AND COOLING OF WAFER

First, before cooling the wafer, heat treatment (thermal treatment C) is conducted at 150–250° C. for 30–60 seconds under the base pressure of $1.5 \times 10^4$ Pa to remove materials such as water adhered to the substrate. Then, before an aluminum film is formed, the temperature of the substrate is lowered to 100° C. or less, and more preferably to the normal temperature (less or equal 50° C. ). This cooling process is important to lower the temperature of the substrate which has been heated up through the thermal treatment C. For example, the wafer is placed on a table with water cooling function to cool the wafer to a desired temperature.

By cooling the wafer, the amount of gas which may be discharged from the first interlayer insulation film I1, the barrier 33, and the entire surface of the wafer at the time of film growth of the first aluminum film is reduced to a minimum amount. As a result, this prevents deteriorating effects by the gas which is adsorbed on the interface between the barrier layer 33 and the first aluminum film 34 and which damage their coverage and bonding properties.

Formation of Aluminum Film

First, at temperature below 200° C., and more preferably, at 30–100° C., an aluminum film of 150–300 nm thickness containing 0.2–1.0 weight % of copper is formed by sputtering at high speed, to form the first aluminum film 34. Next, the wafer is heated at the substrate temperature of 420–460° C. in the same chamber, and a film of aluminum containing copper is formed at low speed by sputtering, to thereby form a second aluminum film 35 having a thickness of 300–600 nm. It is noted that the level of "high speed" may vary depending on the film growth condition and design specification of a device to be manufactured. However, in this embodiment, the "high speed" means a sputtering speed of about 10 nm/second or faster, and the "low speed" means the sputtering speed of about 3 nm/second or slower.

Figure 6:
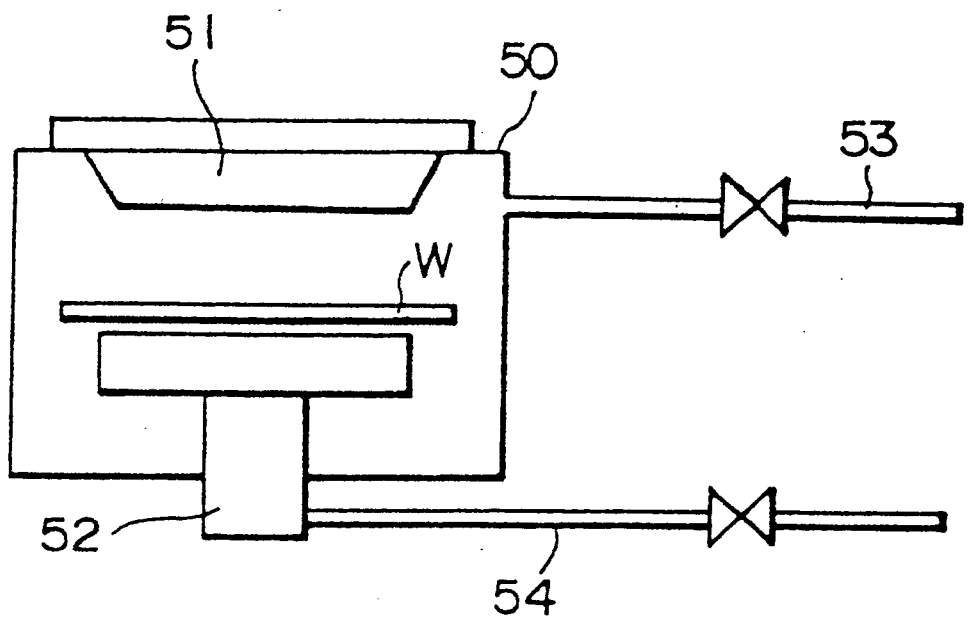
FIG. 6 schematically shows a sputtering apparatus to be used in the embodiments of the present invention.

FIG. 6 shows one example of a sputtering apparatus to be used for forming the first aluminum film 34 and the second aluminum film 35. The sputtering apparatus includes a chamber 50 that contains a target 51 functioning also as an electrode and an electrode 52 functioning as a stage which is structured to mount a substrate (wafer) W to be treated. A first gas supply channel 53 is connected to the chamber 50, and a second gas supply channel 54 is connected to the electrode 52. Argon gas is supplied through both of the gas supply channels 53 and 54. The temperature of the wafer W is controlled by the gas that is supplied from the second gas supply channel 54. An apparatus to discharge the gas in the chamber 50 is not shown.

Figure 7:
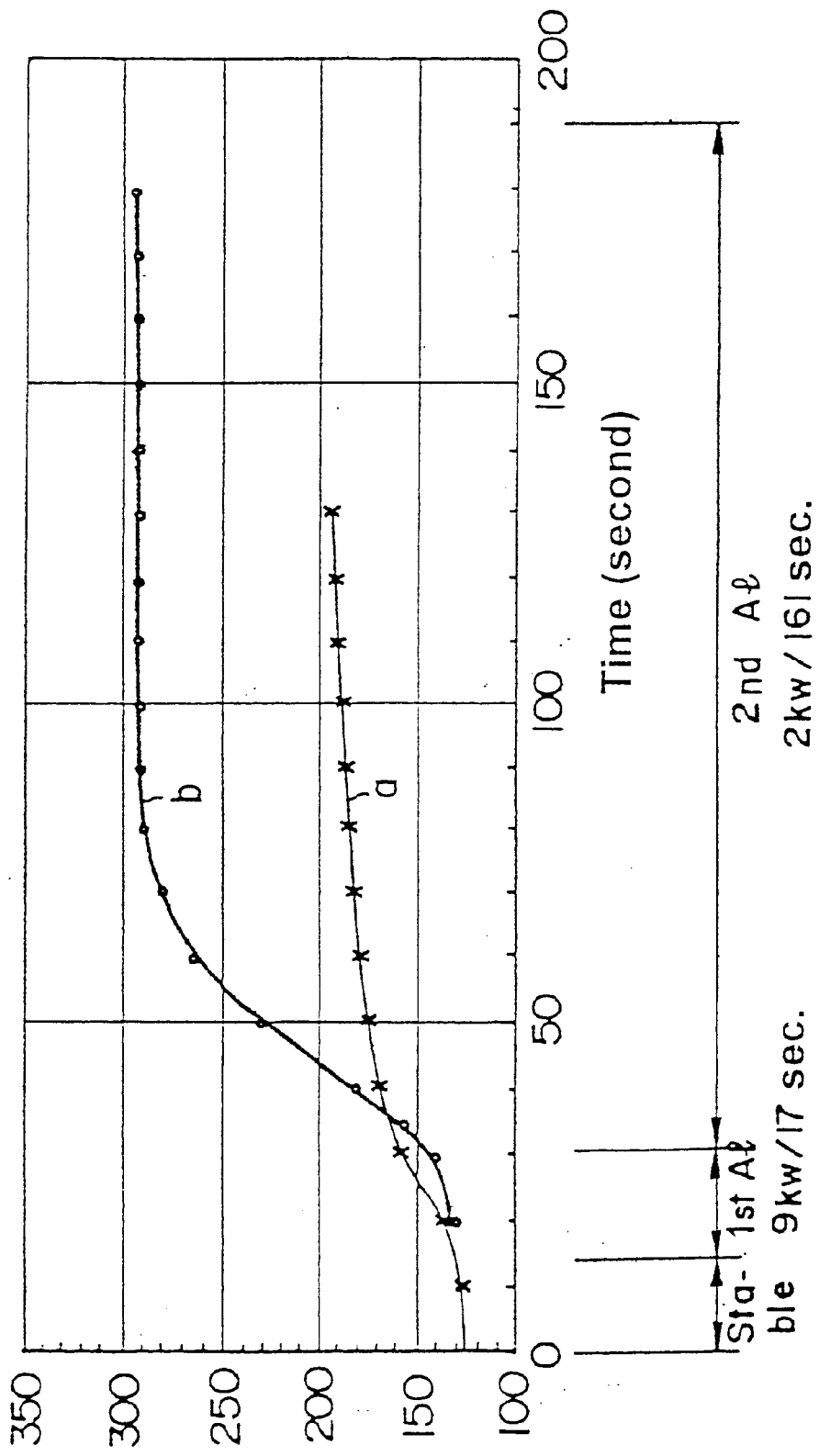
FIG. 7 shows the relationship between time and substrate temperature when the substrate temperature is controlled using the sputtering apparatus shown in FIG. 6.

One example to control the substrate temperature by the sputtering apparatus is illustrated in FIG. 7. In FIG. 7, the axis of abscissa represents the time elapsed, the axis of ordinate represents the substrate (wafer) temperature, respectively. A line marked with a letter a indicates the change in the substrate temperature when the stage 52 of the sputtering apparatus is set at 350° C., a line marked with a letter b indicates the change in the substrate temperature when the temperature of the stage 52 is increased by supplying high temperature argon gas through the second gas supply channel 54 into the chamber.

For example, the substrate temperature is controlled as follows. The temperature of the stage 52 is pre-heated and set at a film forming temperature for forming the second aluminum film (350–500° C.). When the first aluminum film is formed, the substrate temperature is gradually increased by heating the stage 52 without gas supply from the second gas supply channel 54, as indicated by the line a shown in FIG. 7. When the second aluminum film is formed, the substrate temperature is controlled to rapidly increase by supplying heated gas through the second gas supply channel 54, and to be stabilized at a predetermined temperature level, as indicated by the line b shown in FIG. 7.

In the example shown in FIG. 7, the temperature of the stage is set at 350° C., and the first aluminum film 34 is formed while the substrate temperature is set at 125–150° C., and immediately thereafter, the second aluminum film 35 is formed.

In the process of forming the aluminum film, control of film forming speed and substrate temperature as well as the control of power applied to the sputtering apparatus are important. More specifically, the first aluminum film 34 is formed with a high power, and the second aluminum film 35 is formed with a lower power, although it depends on the film forming speed. Most importantly, the power should not be reduced to zero when the power is switched from the high power to the lower power. If the power is reduced to zero, an oxide film is formed on the surface of the first aluminum film even at a reduced pressure, and the wettability of the second aluminum film with respect to the first aluminum film is lowered, and bonding between the films is deteriorated. In other words, by continuously applying power, active aluminum is continuously supplied onto the surface of the aluminum film during the film formation, and formation of an oxide film is prevented. The level of power is preferably set at 5–10 kw for the high power and at 300 W–1 kW for the lower power, for example, under the temperature condition shown in FIG. 7, although it may vary depending on the sputtering apparatus and film forming condition.

By successively forming the first aluminum film 34 and the second aluminum film 35 in the same chamber, the temperature and the power can be precisely controlled and stable aluminum films are effectively formed at a lower temperature than the conventional method.

The thickness of the first aluminum film 34 is selected to be in a proper range in consideration of the capability to form successive layers in good step coverage and the capability to control the discharge of gasification components from the barrier layer 33 and the first interlayer insulation film I1 underlying below the aluminum film 34. For example, the thickness is preferably between 200–400 nm. The thickness of the second aluminum film 35 is determined by the size of a contact hole and its aspect ratio. For example, the thickness of 300–1,000 nm is necessary to cover a hole smaller than 0.5 μm in diameter with aspect ratio of about 3.

Formation of Antireflection Film

Further, an antireflection film 36 with a thickness of 30–80 nm is formed by depositing TiN through sputtering in another sputter chamber. Then, a first metal wiring layer is patterned by selectively etching a laminated layer of the barrier layer 33, the first aluminum film 34, the second aluminum film 35 and the antireflection film 36, using anisotropic dry etcher made mainly from $CL_2$ and $BCL_3$ gas.

In the metal wiring layer 30 thus formed, it is confirmed that the contact hole with an aspect ratio of 0.5–3 and a diameter of 0.2–0.8 μm is filled by the aluminum with good step coverage without creating voids.

Below, steps shown in FIG. 3(A) are described.

Formation of Second Interlayer Insulation Film I2

A second interlayer insulation film I2 has basically a similar structure as that of the first interlayer insulation film I1. Namely, the second interlayer insulation film I2 is comprised of four layers of silicon oxide films, i.e., from the bottom, a first silicon oxide film 70, a second silicon oxide film 72, a third silicon oxide film 74, and a fourth silicon oxide film 76, respectively. The silicon oxide films 70, 72, 74 and 76 are formed in a similar process as the process used to form the silicon oxide films 20, 22, 24 and 26 except for the anneal treatment. Main steps will be described below, while the description of common steps are omitted.

a. Formation of the first silicon oxide film 70

First, by the reaction between tetraethoxysilane (TEOS) and oxygen by plasma chemical vapor deposition (CVD) method at temperature of 300–500° C., the first silicon oxide film 70 with a thickness of 50–200 nm is formed.

b. Formation of the second silicon oxide film 72

Next, the second silicon oxide film 72 is formed by reacting $SiH_4$ and $H_2O_2$ at temperature of 0|10° C. by CVD method with nitrogen gas as a carrier at a reduced pressure preferably at $2.5\times10^2$ Pa or lower, and more preferably at $0.3\times10^2$–$2.0\times10^2$ Pa. The second silicon oxide film 72, like the silicon oxide film 22, has a thickness larger than step differences in the underlying first silicon oxide film 70, in other words, a thickness that sufficiently covers the step differences. The upper limit of the thickness of the silicon oxide film 72 is set to a level that prevents cracks from being generated in the film. More specifically, the thickness of the second silicon oxide film 72 is preferably thicker than the step differences of the underlying layer in order to obtain better flatness, and is preferably set between 500–1,000 nm.

The film forming temperature of the second silicon oxide film 72 is preferably set at 0–20° C., and more preferably, at 0–10° C.

The second silicon oxide film 72 formed in this process has a high fluidity and a superior planarization property.

c. Formation of the third silicon oxide film 74

A PSG film (the third silicon oxide film) 74 having a thickness of 100–600 nm is formed through the reaction by plasma CVD method with high frequency between 200–600 kHz, at temperature of 300–450° C. under the presence of $SiH_4$, $PH_3$ and $N_2O$.

The third silicon oxide film 74, like the third silicon oxide film 24, needs to be porous so that gasification components such as water contained in the second silicon oxide film 72 are readily and sufficiently eliminated in annealing treatment to be followed. To this end, the third silicon oxide film 74 is formed through high frequency plasma CVD method preferably at temperature of 450° C. or lower, and more preferably at temperature of 300–400° C., preferably at a frequency of 1 MHz or lower, more preferably at a frequency of 200–600 kHz, and an impurity such as phosphorus is preferably contained. Since the third silicon oxide film 74 contains such impurity, the third silicon oxide film 74 becomes more porous and thus can relieve the stress in the film. The concentration of such impurity is determined in consideration of the stress resistivity, the gettering effect and other factors. For example, when phosphorus is used as an impurity, 1–6 weight % of phosphorus is preferably contained in the film.

When $N_2O$ is used as a compound including oxygen in the plasma CVD, elimination of hydrogen bonds in the second silicon oxide film 72 is promoted. As a result, gasification components such as water contained in the second silicon oxide film 72 are more securely removed.

The thickness of the third silicon oxide film 74 is preferably 100 nm or greater, and more preferably between 200 and 600 nm.

d. Anneal treatment

Next, anneal treatment is conducted at temperature between 350 and 500° C. By the anneal treatment, the second silicon oxide film 72 and the third silicon oxide film 74 are densified, and acquire good insulation and water-resisting property. In other words, by setting the anneal temperature at 350° C. or over, the condensation polymerization reaction of silanol in the second silicon oxide film 72 is substantially perfectly completed, and water contained in the film is sufficiently discharged so that the formed films have a high density. By setting the anneal temperature at 500° C. or lower, no negative effects are given to the aluminum film composing the first wiring layer 40.

e. Formation of the fourth silicon oxide film 76

Next, using TEOS and oxygen, the fourth silicon oxide film 76 having a thickness of 1,000–1,500 nm is formed through plasma CVD method at 350–400° C.

(G) Steps illustrated in the FIG. 3(B) are described below.

Flattening by CMP

Next, with chemical mechanical polishing (CMP), the fourth silicon oxide film 76, if necessary, the third silicon oxide film 74 and the second silicon oxide film 72, are polished and smoothed to a predetermined film thickness. Even when portions of the third silicon oxide film 74 or the second silicon oxide film 72 are exposed during polishing, flat surfaces are obtained because of the flattening process, and therefore, it is easy to manage the polishing amount.

(H) Steps illustrated in FIG. 4 (A) are described below.

Formation of Via Hole

The second interlayer insulation film I2 and the antireflection film 36 are selectively etched by selective anisotropic etching with a reactive ion etcher including $CHF_3$ and $CF_4$ as main gas to form a via hole 62 of 0.3–0.5 μm in diameter.

The via hole 62, like the contact hole 32, has a tapered hole having a diameter gradually reducing from a top end portion to a bottom end portion thereof. Although the taper angle θ may vary depending on etching conditions and other factors, the taper angle is set, for example, at 5–15 degrees.

(I) Steps illustrated in FIG. 4(B) are described below.

Degassing Treatment

First, heat treatment including a degassing treatment is described.

In a lamp chamber, the lamp heating (thermal treatment D) is conducted for 30–60 seconds at a base pressure of $1.5\times10^{-4}$ Pa, at temperature of 150–250° C. Then, argon gas is introduced in another chamber under a pressure of $1\times10^{-1}$–$15\times10^{-1}$ Pa, and heat treatment (degassing treatment; thermal treatment E) is conducted for 30–120 seconds at 300–550° C., to thereby conduct degassing treatment.

In this process, first with thermal treatment D, mainly, the entire wafer including its rear and side surfaces are heat treated so that moisture adhered to the wafer can be removed.

Further, with the thermal treatment E, mainly, gasification components (H, $H_2O$) contained in the second interlayer insulation film I2 are removed. As a result, at the time of forming an wetting layer and an aluminum film in the following process, generation of the gasification components from the second interlayer insulation film I2 can be prevented.

A wetting layer, for example, a TiN film contains some tens of atoms % of gasification components (O, H, $H_2O$, N) as solid solution. Therefore, removal of the gasification components in the first interlayer insulation film I2 before the formation of the TiN film is very effective to form an aluminum film in a via hole in good condition. Unless the gasification components in the second interlayer insulation film I2 under the wetting layer are sufficiently removed, the gasification components in the second interlayer insulation layer I2 are discharged into the wetting layer when the wetting layer is formed. Further, the gas is eliminated from the wetting layer and appears on the interface between the wetting layer and an aluminum film when the aluminum film is formed in the following step, causing negative effects on the bonding property and the fluidity of the aluminum film.

Film Formation of Wetting Barrier

A titanium film having a thickness of 20–70 nm is formed by sputtering method as a film composing the wetting layer 63. The sputtering temperature is preferably 100° C. or lower, and more preferably 25° C. or lower.

Cooling Wafer Before the Aluminum Film Formation

Before forming the aluminum film, the temperature of the substrate is lowered to 100° C. or lower, and more preferably to the normal temperature to 50° C. The cooling step is important to lower the temperature of the substrate which has been heated up by the sputtering of the wetting layer 63. For example, the wafer is cooled to a specified temperature by placing it on a stage equipped with water cooling function.

By cooling the wafer in a manner described above, the amount of gas which may be discharged from the second interlayer insulation film I2, the wetting layer 63 and the whole surface of the wafer when the first aluminum film is formed is reduced to an extremely low level. As a result, effects of the gas which may be adsorbed to the interface of the wetting layer 63 and the first aluminum film 64 and which may deteriorate the coverage and bonding properties are substantially eliminated.

Film Growth of Aluminum Film

First, a first aluminum film 64 is formed by sputtering aluminum containing 0.2–1.0 weight % of copper at a high speed at temperature of 200° C. or lower, and more preferably at 30–100° C. to a thickness of 150–300 nm. Then, the substrate temperature is raised to 420–460° C. in the same chamber, and aluminum similarly containing copper is sputtered at a low speed to form a second aluminum film 65 having a thickness of 300–600 nm.

A sputtering apparatus similar to the one illustrated in FIG. 6 can be used. Since the sputtering apparatus has the same structure, and uses the same wafer temperature control and the power for sputtering as those used for forming the first metal wiring layer 30, detailed description thereof is omitted.

By successively forming the first aluminum film 64 and the second aluminum film 65 in the same chamber, the temperature and power can be controlled more precisely, and the stable aluminum films are more effectively formed at a lower temperature than the conventional method.

The thickness of the first aluminum film 64 is selected to be in a proper range in consideration of the capability to form successive layers in good step coverage and capability to control the discharge of gasification components from the wetting layer 63 and the second interlayer insulation film I2 below the aluminum film 64. For example, the thickness is preferably between 100–300 nm. The thickness of the second aluminum film 65 is determined by the size of the via hole 62 and its aspect ratio. For example, the thickness of 300–800 nm is necessary to cover the hole smaller than 0.5 $\mu$m in diameter with aspect ratio of about 3.

Formation of Antireflection Film

Further, an antireflection film 66 with a thickness of 30–80 nm is formed by depositing TiN through sputtering in another sputter chamber. Then, a second metal wiring layer 60 is patterned by selectively etching a laminated layer of the wetting layer 63, the first aluminum film 64, the second aluminum film 65 and the antireflection film 66, using anisotropic dry etcher mainly containing $CL_2$ and $BCL_3$ gas.

In the metal wiring layer 30 thus formed, it is confirmed that a via hole with an aspect ratio of 0.5–3 and a diameter of 0.2–0.8 $\mu$m is filled by the aluminum with good step coverage without creating voids.

Following the above-described steps, other multilayered wiring regions, such as a third wiring region, a fourth wiring region, and so on, can be formed in the same manner as the second wiring region L2, depending on the requirements, (J) Steps illustrated in FIG. 5 are described below.

Formation of Protective Insulation Film PL

The protective insulation film PL is comprised of three layers of silicon oxide films, namely from the bottom, a first silicon oxide film 80, a second silicon oxide film 82, and a third silicon oxide film 84. The silicon oxide films 80, 82 and 84 are formed by a process similar to that used in forming the silicon oxide films 20, 22 and 24 except the anneal treatment. Main steps will be described below, however common steps are omitted. The third silicon oxide film 84 can be a silicon oxide film that does not contain phosphorus.

a. Formation of the first silicon oxide film 80

First, the first silicon oxide film 80 with a thickness of 50–500 nm is formed through the reaction between tetraethoxysilane (TEOS) and oxygen by plasma chemical vapor deposition (CVD) at temperature of 300–500° C.

b. Formation of the second silicon oxide film 82

Next, the second silicon oxide film 82 is formed by reacting $SiH_4$ and $H_2O_2$ at temperature of 0–10° C. by CVD method with nitrogen gas as a carrier at a reduced pressure preferably at $2.5 \times 10^2$ Pa or lower, and more preferably at $0.3 \times 10^2$–$2.0 \times 10^2$ Pa. The second silicon oxide film 82, like the silicon oxide film 22, has a thickness greater than step differences in the underlying first silicon oxide film 80, in other words, a thickness that sufficiently covers the step differences. The upper limit of the thickness of the silicon oxide film 82 is set to a level that prevents cracks from being generated in the film. More specifically, the thickness of the second silicon oxide film 82 is preferably thicker than the step differences of the underlying layer in order to obtain better flatness, and is preferably set between 500–1,000 nm.

The film forming temperature of the second silicon oxide film 82 is preferably set at 0–20° C., and more preferably, at 0–10° C.

The second silicon oxide film 82 formed in this process has a high fluidity and a superior planarization property.

c. Formation of the third silicon oxide film 84

The third silicon oxide film 84 is formed through the reaction by plasma CVD method at temperature of 300–450° C. with high frequency between 200–600 kHz, under the presence of $SiH_4$ and $N_2O$.

The third silicon oxide film 84, like the third silicon oxide film 24, needs to be porous so that gasification components such as water contained in the second silicon oxide film 82 are readily and sufficiently eliminated in annealing treatment to be conducted later. To this end, the third silicon oxide film 84 is formed through high frequency plasma CVD method preferably at temperature of 450° C. or lower, and more preferably at temperature of 300–400° C., preferably at a frequency of 1 MHz or lower, more preferably at a frequency of 200–600 kHz, and an impurity such as phosphorus that may be provided by introduction of $PH_3$ gas is preferably contained. Since the third silicon oxide film 84 contains such impurity, the third silicon oxide film 84 becomes more porous and thus can relieve the stress in the film. The concentration of such impurity is determined in consideration of the stress resistivity, the gettering effect and other factors. For example, when phosphorus is used as an impurity, 1–6 weight % of phosphorus is preferably contained in the film.

When $N_2O$ is used as a compound including oxygen in the plasma CVD, elimination of hydrogen bonds in the second silicon oxide film 82 is promoted. As a result, gasification components such as water contained in the second silicon oxide film 82 are more securely removed.

The thickness of the third silicon oxide film 84 is preferably 100 nm or greater, and more preferably between 200 and 600 nm.

d. Anneal treatment

Next, anneal treatment is conducted at temperature between 350 and 500° C. By the anneal treatment, the second silicon oxide film 82 and the third silicon oxide film 84 are densified, and acquire good insulation and water-resisting property. In other words, by setting the anneal temperature at 350° C. or higher, the condensation polymerization reaction of silanol in the second silicon oxide film 82 is substantially perfectly completed, and water contained in the film is sufficiently discharged so that the formed films have high density. By setting the anneal temperature at 500° C. or lower, no negative effects are given to the aluminum film composing the first wiring layer 60.

e. Formation of silicon nitride film 86

Next, a silicon nitride film 86 at the top most layer is formed by reacting $SiH_4$ and $NH_3$ at 350–400° C. using nitrogen gas as a carrier by plasma CVD method. The silicon nitride film 86 has, for example, a thickness of 300–1,500 nm, in order to provide sufficient passivation function.

Then, the protective insulation film PL is selectively etched by dry etching or wet etching using a photoresist (not shown) as a mask to form a hole that forms a bonding pad section for leading out external electrodes. Depending on the requirements, a film such as a polyimide resin film can be further deposited thereon in order to relieve the stress at the time of resin molding of the semiconductor apparatus.

In accordance with the present embodiment, a high degree of planarization is achieved by the first silicon oxide film 80 and the second silicon oxide film 82. As a result, the silicon nitride film 86 having a passivation function has a high degree of adhesion and fluidity and therefore becomes flat, and locally thin areas or defects are not generated, resulting in a protective insulation film PL with superior moisture-resistance and contamination-resistance. Furthermore, in the protective insulation film PL, a silicon oxide film having a dielectric constant smaller than that of silicon nitride exists between adjacent metal wire layers 60a and 60b in the second metal wiring layer 60. As a result, effects of capacitance present along a direction in parallel with the surface of the silicon substrate 11 (horizontal direction) is minimized. As a consequence, electric characteristics such as device operation speed are improved compared to the structure in which a silicon nitride film with a higher dielectric constant exists between adjacent metal wiring layers.

Also, the second silicon oxide film 82 formed by condensation and polymerization reaction between a silicon compound and hydrogen peroxide has almost the same etching characteristics, such as for example, the same etching speed, as those of the first and third silicon oxide films 80 and 84 formed by plasma CVD etching. Therefore, dry etching as well as simple wet etching using, for example, a mixed acid of HF and $NH_4F$ can be used.

If, for example, a SOG film is used as a film equivalent to the second silicon oxide film 82, chipping and cracking problems would likely occur in the overlying films above the SOG film because the SOG film has a high etching speed and likely develops side-etching.

In accordance with the present embodiment, the first and second interlayer insulation films I1 and I2 and the protective insulation film PL have superior planarization property because of the following reasons.

Because the second silicon oxide films 22, 72 and 82 produced in the process illustrated in FIG. 1(B), FIG. 3(A) and FIG. 5 contain reactive products including silanol having high fluidity, which are produced by the reaction between a silicon compound and hydrogen peroxide. As a result, protrusions and pits on the surface of the wafer are highly planarized when the films are formed.

In accordance with the present embodiment, the contact hole 32 and the via hole 62 are filled in good condition with the first and second aluminum films 34, 35 45 and the first and second aluminum films 64, 65, respectively, because of the following reasons.

(a) By conducting degassing process, water and nitrogen contained in the interlayer insulation films I1 and I2 are gassified and sufficiently discharged. As a result, when the first aluminum films 34, 64 and the second aluminum films 35, 65 are formed at a later stage, generation of gas from the interlayer insulation films I1 and I2, the barrier layer 33 or the wetting layer 63 is prevented. As a consequence, the bonding between the barrier layer 33 and the aluminum film 34 and between the wetting layer 63 and the first aluminum film 64 is improved, and the films are formed with good step coverage.

(b) The substrate temperature is set at a relatively low temperature of 200° C. or lower when the first aluminum films 34 and 64 are formed so that water content and nitrogen contained in the interlayer insulation films I1, I2, the barrier layer 33 and the wetting layer 63 are prevented from discharging. As a result, in addition to the effects of the degassing process discussed above, the bonding between the first aluminum films 34 and 64 is further improved.

(c) Furthermore, the first aluminum films 34 and 64 themselves act to restrict generation of gas from the underlying layers when the substrate temperature is increased. As a result, in a succeeding process, the second aluminum film 35 and 65 can be formed at a relatively high temperature, and therefore excellent flow diffusion of the second aluminum film is achieved.

Semiconductor Device

A semiconductor device (see FIG. 5) in accordance with an embodiment of the present invention is manufactured by the method described above. The semiconductor device has the silicon substrate 11 including at least a MOS device and the first wiring layer region L1 formed on the silicon substrate 11. The first wiring layer region L1 has the first interlayer insulation film I1 that includes the silicon oxide film 20 as a base layer, the second silicon oxide film 22 formed by condensation polymerization reaction between a silicon compound and hydrogen peroxide, the third silicon oxide film 24 formed on the second silicon oxide film 22 and containing an impurity such as phosphorus, and the fourth silicon oxide film 26 that is planarized by CMP and formed on the third silicon oxide film 24; the contact hole 32 formed in the interlayer insulation film I1; the barrier layer 33 formed on surfaces of the interlayer insulation film I1 and the contact hole 32; and the aluminum layers 34, 35 of aluminum or an alloy containing aluminum as a main component formed on the barrier layer 33. The aluminum film 34 is connected to the titanium silicide layer 19 through the barrier layer 33.

The second wiring layer region L2 formed on the first wiring layer region L1 has the second interlayer insulation film I2 that includes the first silicon oxide film 70 as a base layer, the second silicon oxide film 72 formed by condensation polymerization reaction between a silicon compound and hydrogen peroxide, the third silicon oxide film 74 formed on the second silicon oxide film 72 and containing an impurity such as phosphorus, and the fourth silicon oxide film 76 that is planarized by CMP and formed on the third silicon oxide film 74; the via hole 62 formed in the interlayer insulation film I2, the wetting layer 63 formed on surfaces of the interlayer insulation film I2 and the via hole 62, and the aluminum films 64 and 65 of aluminum or an alloy containing aluminum as a main component formed on the wetting layer 63.

The protective insulation film PL formed on the second wiring region L2 has the first silicon oxide film 80 as a base layer, the second silicon oxide film 82 formed by condensation polymerization reaction between a silicon compound and hydrogen peroxide, the third silicon oxide film 84 including an impurity such as phosphorous and formed on the second silicon oxide film 82, and the silicon nitride film 86 formed on the silicon oxide film 84.

As described above, according to the embodiment of the present invention, there is provided a silicon oxide film including a condensation polymerization product of silanol produced by the vapor-phase reaction between a silicon compound and hydrogen peroxide. As a result, the protective insulation film PL and the interlayer insulation films I1 and I2 are provided with a high degree planarization.

The first interlayer insulation film I1 can be formed at a temperature substantially lower than the temperature which is required by the conventional BPSG film. As a result, the characteristics such as punch-through and junction leak are improved. Therefore, the method provides further device miniaturization and highly reliable contact structures, and is also advantageous from the viewpoint of the manufacturing process.

Since the interlayer insulation films I1 and I2 have a high degree of planarization property, the process margin including process for wiring layers is increased, and the quality and yield are improved.

Since the protective insulation film PL includes the second silicon oxide film 82 which has superior planarization property, the silicon nitride film 86 can be formed with high passivation functions, uniform thickness and less defects. Also, the electric characteristics are improved as a result of the reduced capacitance between metal wiring layers on the same layer level.

In accordance with the embodiment of the present invention, at least the degassing process and cooling process are conducted before conducting the sputtering for the aluminum films. In addition, preferably, the aluminum films are consecutively formed in the same chamber. As a result, contact holes and via holes having a diameter of up to about 0.2 $\mu$m are filled only with aluminum or an aluminum alloy so that the reliability and the manufacturing yield are improved. Also it is confirmed that the aluminum film that forms the contact section does not have any segregation or abnormal crystal growth of copper and other components, and presents excellent reliability in many respects including migration.

Other Embodiments

This present invention is not limited to the above-described embodiment, and a part thereof can be replaced with the following means.

(a) In the above-described embodiment, nitrogen monoxide ($N_2O$) is used as a compound containing oxygen when the third silicon oxide films 24, 74 and 84 are formed by plasma CVD. However, ozone can be used instead of nitrogen monoxide. Preferably, the wafer is exposed to ozone atmosphere before forming the third silicon oxide films 24, 74 and 84.

Figure 8:
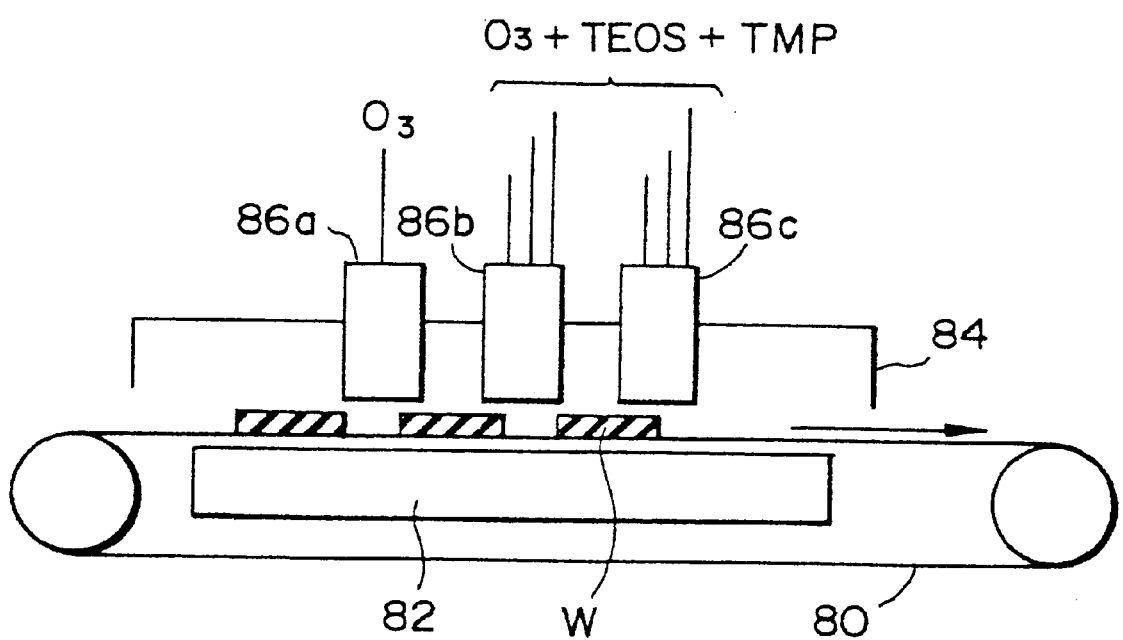
FIG. 8 schematically shows a belt furnace to be used for manufacturing a semiconductor device.

For example, using a belt furnace illustrated in FIG. 8, a wafer W placed on a heated conveyor belt 80 which is heated to 400–500° C. by a heater 82 is transferred at a predetermined speed. While it is transferred, ozone is supplied from a first gas head 86a. The wafer W is transferred in the ozone-containing atmosphere containing 2–8 weight % ozone for over five minutes. Then, ozone, TEOS and TMP ($P(OCH_3)_3$) are supplied from a second gas head 86b and a third gas head 86c at generally normal pressure to form PSG films (the third silicon films) 24, 74 and 84 with concentration of phosphorus being 3|6 weight % and a thickness being 100–600 nm. It is noted that a reference numeral 84 in FIG. 8 denotes a cover.

By using ozone instead of nitrogen monoxide, a silicon oxide film is formed by TEOS through normal-pressure CVD. Also, the belt furnace contributes to the effective and successive film growth.

When the wafer W is exposed to ozone-containing atmosphere, it is confirmed by thermal detaching specter (TDS) and infrared spectroscopy method (FTIR) that the second silicon oxide films 22, 72 and 82 have low hygroscopicity and less water, that the interlayer insulation films I1 and I2 have a good planarization property equivalent to that obtained by using nitrogen monoxide as a reactive gas, that good MOS transistor characteristics are achieved, and that no cracks are generated in the second silicon oxide films 22, 72, and 82.

(b) In the above-described embodiment, a silicon oxide film formed by plasma CVD using TEOS is used as the first silicon oxide film 20. However, other silicon oxide films can be used instead. For example, a film formed by reduced pressure thermal CVD method using monosilane and nitrogen monoxide may be used as the first silicon oxide film. This silicon oxide film precisely conforms to the surface configuration of the underlying silicon substrate, and has good step coverage and excellent passivation function because it has high density. Furthermore, the second silicon oxide film 22 is difficult to develop cracks even when the temperature is rapidly increased in the anneal treatment.

Also, the thermal CVD method is advantageous because plasma damage is not created.

However, this film growth method requires the wafer temperature to be set at about 750–800° C., and therefore cannot be applied on a film that is readily oxidized, such as a titanium silicide film in a salicide structure. Therefore, tungsten silicide or molybdenum silicide should be used.

(c) In the above-described embodiment, the first interlayer insulation film I1 is comprised of four layers of silicon oxide films. However, the present invention is not limited to these embodiment, and other silicon oxide films may be added. For example, a PSG film with a thickness of 100–300 nm (phosphorus concentration; 1|6 weight %) may be formed by plasma CVD method between the first silicon oxide film 20 and the second silicon oxide film 22. It is confirmed that the insertion of the PSG film improves the gettering functions of mobile ions and reduces fluctuations of resting current and threshold characteristic of transistors.

(d) In the above-described embodiment, the protective insulation film PL includes the third silicon oxide film 84. However, it may be structured without the silicon oxide film 84.

In the above-described embodiment, a semiconductor device containing two layered wiring regions. However, the present invention is also applicable to a semiconductor with three or more layered wiring regions. Furthermore, the present invention is applicable not only to a semiconductor device including an N-channel type MOS device but also to a semiconductor device with a variety of other devices such as P-channel type and CMOS type devices. Further, in the above-described embodiment, the fourth silicon oxide films 26 and 76 in the interlayer insulation films I1 and I2 are planarized by CMP. However, this process is not necessary required because the second silicon oxide films 22 and 72 have a superior planarizing property.

While the invention has been described in conjunction with several embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device comprising: a semiconductor substrate, a plurality of wiring regions formed on the semiconductor substrate, a protective insulation film formed on a top-most wiring region, wherein the protective insulation film comprises a first silicon oxide film, a second densified silicon oxide film formed on the first silicon oxide film, a third densified silicon oxide film having a porosity sufficient to mitigate stress and formed on the second silicon oxide film, and a silicon nitride film defining a top-most layer of the protective insulation film, wherein the second densified silicon oxide film covers protrusions and pits on a top-most surface of the first silicon oxide film.

2. A semiconductor device according to claim 1, wherein the first silicon oxide film has a film thickness ranging between 50 and 500 nm.

3. A semiconductor device according to claim 1, wherein the second silicon oxide film has a film thickness that covers protrusions and pits on a top-most surface of the first silicon oxide film.

4. A semiconductor device according to claim 1, wherein the silicon nitride film has a film thickness ranging between 300 and 1500 nm.

* * * * *